(12) United States Patent
Lorenz et al.

(10) Patent No.: US 7,379,373 B2
(45) Date of Patent: May 27, 2008

(54) VOLTAGE SUPPLY CIRCUIT, IN PARTICULAR FOR A DRAM MEMORY CIRCUIT, AS WELL AS A METHOD FOR CONTROLLING A SUPPLY SOURCE

(75) Inventors: Harald Lorenz, South Burlington, VT (US); Manfred Menke, Wolfratshausen (DE); Helmut Seitz, Sauer Lach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/295,160

(22) Filed: Dec. 5, 2005

(65) Prior Publication Data

US 2006/0140039 A1 Jun. 29, 2006

(30) Foreign Application Priority Data

Dec. 4, 2004 (DE) .................. 10 2004 058 612

(51) Int. Cl.
*G11C 5/14* (2006.01)
(52) U.S. Cl. ................. 365/226; 365/227; 365/229
(58) Field of Classification Search ............... 365/226, 365/227, 229
See application file for complete search history.

(56) References Cited

U.S. PATENT DOCUMENTS

| | | | | | |
|---|---|---|---|---|---|
| 4,977,537 | A | * | 12/1990 | Dias et al. ................ | 711/106 |
| 5,175,845 | A | * | 12/1992 | Little ....................... | 713/323 |
| 5,214,316 | A | * | 5/1993 | Nagai ....................... | 327/143 |
| 5,249,298 | A | * | 9/1993 | Bolan et al. ............... | 713/340 |
| 5,442,277 | A | * | 8/1995 | Mori et al. ................ | 323/312 |
| 5,650,974 | A | * | 7/1997 | Yoshimura ................ | 365/229 |
| 5,777,462 | A | * | 7/1998 | Yue .......................... | 323/285 |
| 5,781,062 | A | | 7/1998 | Mashiko et al. | |
| 5,798,961 | A | * | 8/1998 | Heyden et al. ............ | 365/52 |
| 5,818,783 | A | * | 10/1998 | Kim .......................... | 365/226 |
| 5,844,262 | A | * | 12/1998 | Ooishi ...................... | 257/207 |
| 6,046,627 | A | * | 4/2000 | Itoh et al. ................. | 327/546 |
| 6,084,386 | A | * | 7/2000 | Takahashi et al. ........ | 323/273 |
| 6,111,457 | A | * | 8/2000 | Lim et al. ................. | 327/541 |
| 6,134,171 | A | * | 10/2000 | Yamagata et al. ........ | 365/229 |
| 6,340,852 | B1 | * | 1/2002 | Mizoguchi ................ | 307/125 |
| 6,351,179 | B1 | * | 2/2002 | Ikehashi et al. .......... | 327/541 |
| 6,411,157 | B1 | | 6/2002 | Hsu et al. | |
| 6,424,128 | B1 | * | 7/2002 | Hiraki et al. ............. | 323/268 |
| 6,434,076 | B1 | * | 8/2002 | Andersen et al. ......... | 365/222 |
| 6,570,367 | B2 | * | 5/2003 | Bartenschlager et al. ... | 323/269 |
| 6,630,857 | B2 | * | 10/2003 | Mizuno et al. ........... | 327/534 |
| 6,753,720 | B2 | * | 6/2004 | Kono et al. ............... | 327/538 |
| 6,838,927 | B2 | * | 1/2005 | Oonishi .................... | 327/534 |
| 7,032,986 | B2 | * | 4/2006 | Corrigan ................... | 347/9 |
| 7,053,592 | B2 | * | 5/2006 | Pihet et al. ............... | 323/266 |

FOREIGN PATENT DOCUMENTS

DE 19615413 A1 2/1997

* cited by examiner

*Primary Examiner*—Viet Q. Nguyen
(74) *Attorney, Agent, or Firm*—Patterson & Sheridan, L.L.P.

(57) ABSTRACT

A voltage supply circuit for providing an internal supply voltage in an integrated circuit is provided. The voltage supply circuit comprises a supply source for setting the internal supply voltage on a supply voltage line and a control circuit which is connected to the supply source for switching on and off the supply source. The control circuit can itself be switched off and regularly switched on again, wherein the control circuit includes a control unit in order to switch the supply source on and off in such a way that the internal supply voltage on the supply voltage line differs essentially by no more than a limit value as a result of capacitive charge storage.

19 Claims, 2 Drawing Sheets

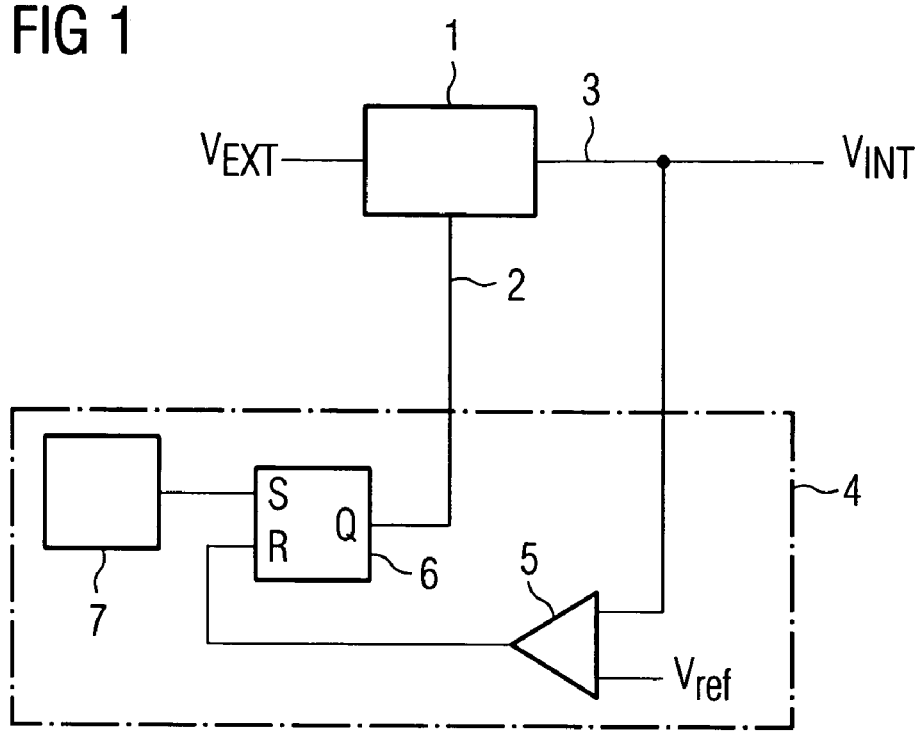
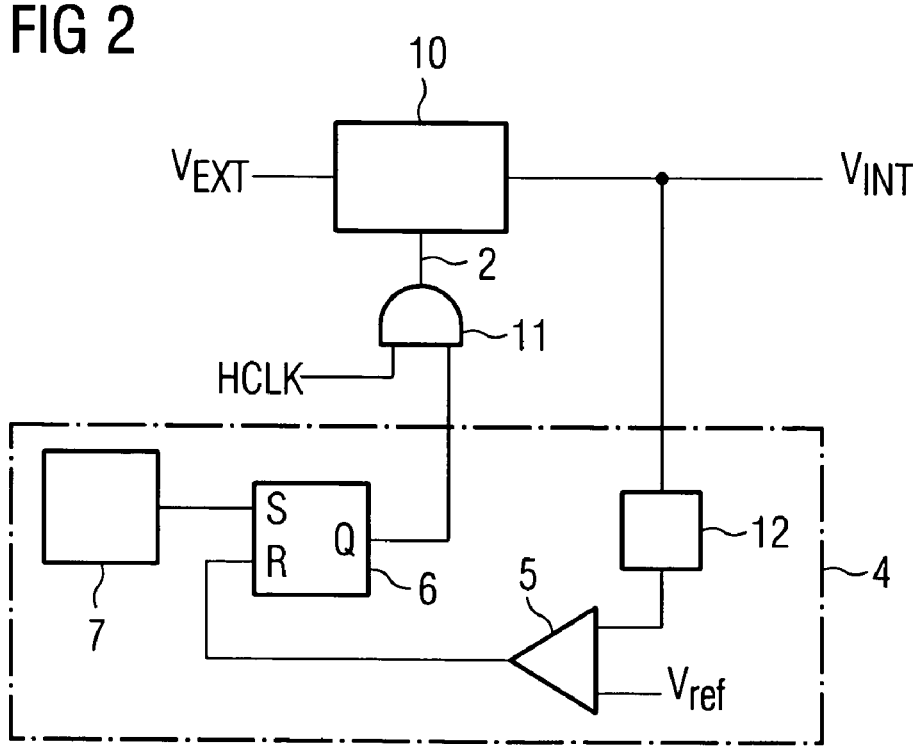

VOLTAGE SUPPLY CIRCUIT, IN PARTICULAR FOR A DRAM MEMORY CIRCUIT, AS WELL AS A METHOD FOR CONTROLLING A SUPPLY SOURCE

CROSS-REFERENCE TO RELATED APPLICATIONS

This application claims foreign priority benefits under 35 U.S.C. §119 to co-pending German patent application number DE 10 2004 058 612.8, filed 4 Dec. 2004. This related patent application is herein incorporated by reference in its entirety.

BACKGROUND OF THE INVENTION

1. Field of the Invention

The invention relates to a voltage supply circuit for provision of an internal supply voltage in an integrated circuit. The invention also relates to an integrated dynamic random access memory (DRAM) circuit having a voltage supply circuit. In addition, the invention relates to a method for controlling a supply source, in particular for an integrated circuit.

2. Description of the Related Art

Internal supply sources which apply defined supply potentials to internal supply lines are provided for operation of integrated circuits, in particular semiconductor memory modules. The supply sources are normally operated actively both during normal operation and when the integrated circuit is in a standby mode, in order to make it possible to provide the supply currents which are required in the respective operating mode to the internal supply lines.

Particularly for mobile applications, it is desirable to reduce the current drawn by an integrated circuit, in particular the current drawn in the standby mode. This is generally achieved by a reduction of leakage currents and by improved circuit design.

The supply current during the standby mode depends on a large number of factors, which make it difficult to determine the magnitude of the supply current in advance. By way of example, the supply currents in the standby mode for an integrated DRAM memory circuit are governed by the refreshing of the contents of the memory cells, the leakage currents and the analog components which are activated in the standby mode.

Supply sources for generating an internal supply voltage, in particular for the standby mode of integrated circuits, are thus designed such that they can supply the necessary supply current in any operating mode. The efficiency of such supply sources is accordingly governed by the maximum supply current which they can provide on the internal supply line and the overall current draw which the supply source has for this purpose. A voltage supply circuit which is designed to provide a supply current for normal operation generally has poorer efficiency when providing a smaller standby current since a constant operating current, which is essentially independent of the supply current, is required for operation of the supply source when there is no load current on the internal supply line. Such a voltage supply circuit is thus generally overdesigned in the standby mode. As a result, the current draw of the integrated circuit in the standby mode is greater than it need be for optimum matching of the supply source to the current that is required in the standby mode.

SUMMARY OF THE INVENTION

One object of the present invention is to provide a voltage supply circuit for provision of an internal supply voltage in an integrated circuit, which is matched to the current drawn in a specific operating mode, with the supply current being produced efficiently. A further object of the present invention is to provide an integrated DRAM memory circuit having a voltage supply circuit as such.

A further object of the present invention is to provide a method for controlling a supply source, whose current draw is optimized and which is designed to provide a supply current on an internal supply line as efficiently as possible.

According to a first aspect of the present invention, a voltage supply circuit is provided to produce an internal supply voltage in an integrated circuit. The voltage supply circuit has a supply source to set the internal supply voltage on a supply voltage line. A control circuit is connected to the supply source such that the control circuit for the supply source switches the latter off. The control circuit has a control unit to switch the supply source on and off in such a way that, when a supply current is flowing, the internal supply voltage on the supply voltage line differs essentially by no more than the limit value as a result of capacitive charge storage.

The voltage supply circuit according to the invention can thus switch the supply source within the integrated circuit on and off in order to produce the internal supply voltage on the supply voltage line. Depending on the current flow on the supply voltage line, it is possible to switch the supply source on for a time period, and then to switch it off so that the charge on the supply voltage line, which flows away as a result of the current flow, during the time period in which the supply source is switched on, can be moved from the supply source to the supply voltage line. In the process, the supply voltage line has its own capacitance and is thus able to store charges. If there is any need for a current while the supply source is switched off, the required current is produced by the charge that is stored on the supply voltage line.

According to one embodiment of the invention, the control circuit may have a determination unit which determines whether a voltage at least at the same level as the internal supply voltage is present on the supply voltage line. The control circuit may switch off the supply source when the voltage which is present on the supply voltage line has reached the internal supply voltage. The supply source is operated to set the internal supply voltage in this way only until the desired internal supply voltage is present on the supply voltage line, and the supply source is then switched off in order to be switched on again only at a predetermined switching-on time, in order to once again regulate the internal supply voltage at the desired voltage.

Alternatively, the control circuit may also have a timer circuit in order to switch off the supply source after a predetermined time period after it has been switched on. For this embodiment, there is no need for a determination unit in order to determine the supply voltage on the supply line, provided that the maximum current flow on the supply line is essentially known, and the predetermined time period between switching on and switching off is chosen such that, despite the required supply current on the supply line, the voltage on the supply line does not decay significantly while the supply source is in the switched-off state.

According to one preferred embodiment, the supply source may have a step-down regulator to which an external supply voltage is supplied and which produces an internal supply voltage lower than the external supply voltage.

Alternatively, the supply source may have a charge pump to which an external supply voltage is supplied and which produces an internal supply voltage higher than the external supply voltage.

In the last-mentioned alternative, the charge pump may have an auxiliary oscillator which provides an operating frequency for the charge pump, wherein the control circuit connects the auxiliary oscillator to the charge pump when the supply source is switched on and disconnects the auxiliary oscillator from the charge pump when the supply source is switched off. The control circuit may also switch this oscillator off, and can thus also disconnect it from the supply voltage. Disconnection of the auxiliary oscillator from the charge pump has the advantage that the current drawn by the charge pump can be switched off essentially completely, that is to say, except for leakage currents, since the current drawn by the charge pump itself is required substantially by switching processes within the charge pumps on transistors and the like.

According to one preferred embodiment of the invention, a standby circuit can be provided to switch on the supply source permanently during normal operation and to control the supply source with the aid of the control circuit in a standby mode. This allows a voltage supply circuit to be provided both for provision of the internal supply voltage during normal operation and for the standby mode, with a reduced current draw.

A pulse transmitter can be used for periodic switching-on in such a way that the desired voltage of the supply line is reset at regular intervals.

According to a further aspect of the present invention, an integrated DRAM memory circuit having a voltage supply circuit is provided. The DRAM memory circuit may have a memory cell array and a refresh circuit, in order to periodically refresh the contents of memory cells on the basis of a refresh clock cycle which is produced by a refresh clock transmitter, with the pulse transmitter being coupled to the refresh clock transmitter to switch on the supply source for refreshing the memory cells.

Alternatively, the pulse transmitter may switch the supply source on periodically as a function of a temperature of the integrated memory circuit. This is worthwhile when the current flow in the standby mode depends, for example, on the temperature so that, if the leakage current is increased, the voltage supply circuit is switched on, in order to set the internal supply voltage to the desired voltage, more frequently than at a temperature which results in a low leakage current.

According to a further aspect of the present invention, an integrated DRAM memory circuit is provided having a plurality of voltage supply circuits. The plurality of voltage supply circuits have a plurality of supply sources for a plurality of supply voltage lines and are coupled to a common control unit. The control unit switches the plurality of supply sources off at the same time once appropriate switching-off signals have been received for each of the plurality of supply sources. This makes it possible to further reduce the area that is required for the internal voltage supply circuit, by provision of a common control unit for each of the plurality of voltage supply circuits.

According to a further aspect of the present invention, a method is provided for controlling a supply source, wherein the supply source applies an internal supply voltage to a supply voltage line. The supply source is switched on and off such that, when a supply current is flowing, the internal supply voltage on the internal supply line differs essentially by not more than the limit value as a result of capacitive charge storage. A determination may be made as to whether a voltage at least at the same level as the desired internal supply voltage is present on the supply voltage line, and with the supply source being switched off, as to when the voltage, which is present on the supply voltage line, has reached the internal supply voltage.

It is thus possible not to operate the supply source all the time in an operating state with a reduced current draw. The time period during which the supply source is switched on thus corresponds to the time period which the supply source needs in order to raise the potential on the supply voltage line to the desired potential of the internal supply voltage.

Alternatively, for example, if the current draw on the supply voltage line is known, the supply source can be switched off a predetermined time period after it was switched on, so that the supply source is switched on only for a predetermined time period, in order to charge the supply voltage line to the potential of the internal supply voltage.

An operating frequency can be provided for operation of the supply source, which may be in the form of a charge pump, with the operating frequency being applied to the supply source when the supply source is switched on, and the operating frequency being disconnected from the supply source when it is switched off.

The supply source may be switched on constantly during normal operation, and the supply source may be switched on and switched off as a function of the switch-on signal and of the switch-off signal in a standby mode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a voltage supply circuit according to a first embodiment of the invention;

FIG. 2 shows a voltage supply circuit having a charge pump, according to a second embodiment of the invention;

DETAILED DESCRIPTION OF THE PREFERRED EMBODIMENT

Figure 3:
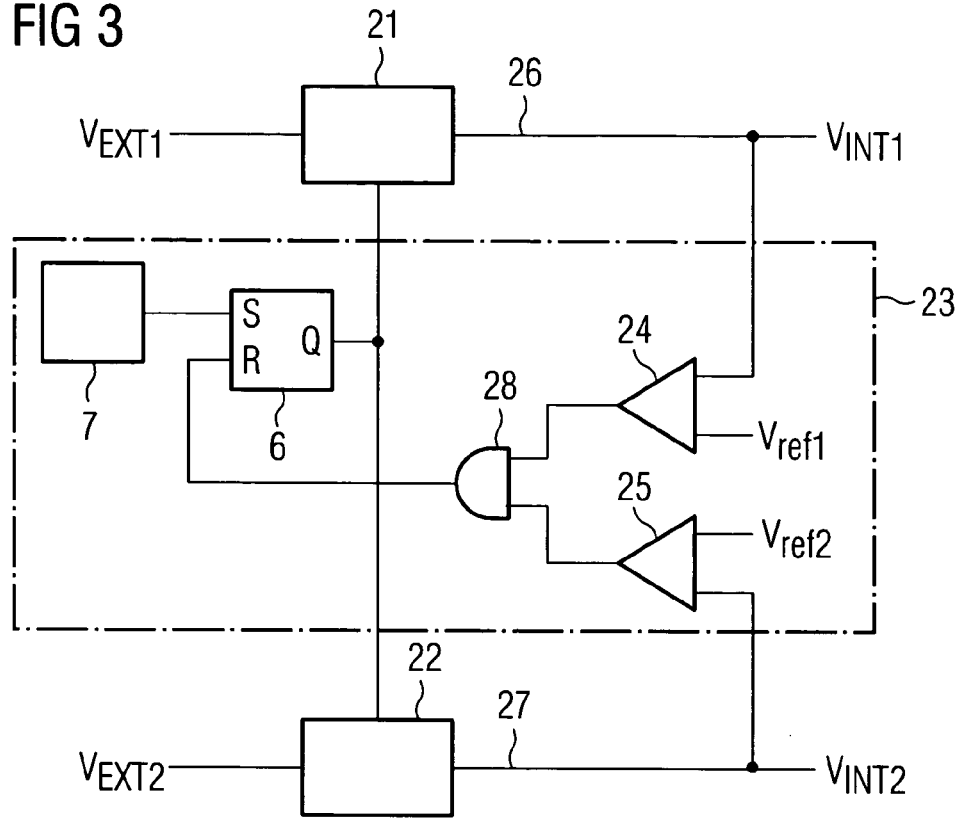
FIG. 3 shows an integrated circuit having two voltage supply sources, which are driven via a common control unit.

FIG. 1 shows a voltage supply circuit according to one embodiment of the present invention. The voltage supply circuit has a supply source 1, which converts an external supply voltage $V_{EXT}$ to an internal supply voltage $V_{INT}$. The supply source is used to convert an external supply voltage $V_{EXT}$, which is subject to interference and voltage fluctuations, to a regulated internal supply voltage $V_{INT}$, which is kept essentially constant irrespective of voltage fluctuations of the external supply voltage.

The supply source 1 illustrated in FIG. 1 has a step-down regulator (not shown), that is to say, the internal supply voltage $V_{INT}$ is lower than the external supply voltage $V_{EXT}$. The supply source 1 has a control connection 2 to which a control signal can be applied via a control line, in order to switch the supply source 1 and the comparator 5 on and off. The supply source 1 is supplied with the external supply voltage $V_{EXT}$ in the switched-on state, and regulates the voltage on an internal supply voltage line 3 such that it corresponds to the desired internal supply voltage $V_{INT}$. In the switched-off state, the supply source 1 is essentially switched off and requires essentially no operating current, with an output connection for the internal supply voltage being connected to a high impedance, so that no charge can flow away through the supply source 1.

The supply source 1 is designed to provide sufficient current when the maximum amount of current is being drawn on the internal supply voltage line 3 during normal operation. In operating states in which less current is drawn via the internal supply voltage line, the supply source in the case of voltage supply circuits according to the prior art is generally operated constantly. However, the conventional supply sources themselves draw an amount of current which is essentially independent of the current on the internal supply voltage line. Particularly when the integrated circuit in which the voltage supply circuit is being used is in a standby mode, a relatively small amount of current, or no current at all, is drawn on the internal supply voltage line, so that the current drawn by the entire integrated circuit is governed to a considerably greater extent by the intrinsic demand of the supply sources that are being operated.

In order to reduce the total amount of current that is drawn by an integrated circuit in an operating state with a small current draw, the invention therefore provides for the supply source 1 not to be switched on all the time, but preferably to be switched on and off cyclically on the basis of a frequency signal or the like. In this case, the intrinsic capacitance of the internal supply voltage line 3 and/or an additional capacitance which is provided on it may be used to store the internal supply voltage for a short time. In this case, the supply source 1 charges the supply voltage line 3 to the internal supply potential $V_{INT}$, and is then switched off, with the rest of the current being drawn from the stored charge.

The switching of the supply source 1 is controlled via the control connection 2 by means of a control circuit 4. The control circuit 4 has a comparator 5, one input of which is connected to the internal supply voltage line 3, and a second input of which is connected to a reference potential $V_{Ref}$. The comparator 5 checks the voltage on the internal supply voltage line 3. When a threshold voltage, which is indicated by the reference potential $V_{REF}$, has been reached, the comparator 5 provides a logic "1" at the output of the comparator 5. The comparator 5 may optionally likewise have a control connection (not shown) in order to be switched on or off as a function of a control signal.

The output of the comparator 5 is connected to a reset input R of an SR flipflop 6. The set input of the SR flipflop 6 is connected to a pulse source 7, which sends a trigger pulse to the set input S at regular time intervals. The trigger pulse causes the output of the SR flipflop 6 to assume a high level. The output of the SR flipflop 6 is connected to the supply source 1 and optionally to the comparator 5, so that the supply source 1 and, optionally, the comparator 5 are/is switched on as a function of the output signal. When the supply source 1 is switched on, the supply source 1 produces the internal supply voltage $V_{INT}$ on the supply voltage line 3 and charges the latter if the voltage which is present on the supply voltage line 3 differs from the internal supply voltage $V_{INT}$. If the comparator 5 finds that the voltage on the supply line 3 has reached or exceeded the reference potential $V_{Ref}$, the comparator 5 provides a high level signal to the reset input R, which resets the SR flipflop 6. The output Q of the SR flipflop 6 then assumes a low level, which switches off the supply source 1 (and the comparator 5). The supply source 1 (and the comparator 5) remains (remain) switched off until the next trigger pulse (high level) from the pulse transmitter 7.

By way of example, the reference potential $V_{REF}$ may correspond to the potential of the internal supply voltage $V_{INT}$, so that the supply source 1 (and the comparator 5) is (are) switched off upon reaching the internal supply voltage $V_{INT}$. The reference potential $V_{Ref}$ may also differ from the desired internal supply voltage by a tolerance value. The supply source 1 (and the comparator 5) is (are) switched on again only on the next trigger pulse from the pulse source 7. It is worthwhile operating the supply source 1 in a mode such as this when a reduced current is being drawn from the supply voltage line 3 and the internal supply voltage has not decayed significantly between the supply source 1 being switched off and being switched on, because of the capacitance and the charge that is flowing away, that is to say, the difference from the nominal value of the internal supply voltage $V_{INT}$ does not exceed a limit value. The frequency of the trigger pulses from the pulse transmitter 7 is thus matched to the intrinsic capacitance of the supply voltage line 3 and/or the driver capability of the supply source 1, so that, during the time period in which the supply source 1 (and the comparator 5) is (are) switched off, the internal supply voltage does not decay significantly as a result of the current flowing, and does not fall below a limit value which can be predetermined. When setting the frequency of the pulse transmitter 7 and on the supply voltage line 3, it is possible, for example, to provide a threshold voltage which the voltage on the supply line 3 must not fall below because of charge flowing away during the state in which the supply source 1 is switched off. For this purpose, the comparator 5 must not be switched off during the phase in which the supply source 1 is switched off.

FIG. 2 shows a further embodiment of the voltage supply circuit according to the invention. The embodiment in FIG. 2 differs from the embodiment in FIG. 1 in that the supply source represents a step-up regulator which, for example, is in the form of a charge pump 10. Those elements which are provided with the same reference symbols correspond essentially to elements with the same function.

Charge pumps are generally operated cyclically, and an auxiliary clock signal is therefore required to charge a pump capacitance in a first phase and to change the connection potentials of the pump capacitance in a second phase, in order to produce an output voltage which is greater than or less than the supply voltages.

In the exemplary embodiment shown, this auxiliary clock signal is applied via an AND gate 11 to the control connection 2 of the charge pump 10. The AND gate 11 is switched on or off as a function of the signal at the output of the SR flipflop 6, so that the switching-on signal results in the auxiliary clock signal HCLK being applied to the charge pump 10, while the switching-off signal, that is to say, the low level at the output of the SR flipflop 6, also changes the output of the AND gate 11 to a low level, so that the charge pump 10 does not receives an auxiliary clock signal, so that no pumping process takes place in the charge pump 10. If the charge pump 10 does not receive an auxiliary clock signal HCLK, then the charge pump 10 no longer draws any significant current, and thus the current drawn can be considerably reduced. The control circuit 4 in the embodiment shown in FIG. 2 is generally similar to that shown in the embodiment in FIG. 1. The output of the SR flipflop 6 can be used to control the comparator 5, in the same way as in FIG. 1. The only difference is that a voltage converter 12 is additionally provided, which reduces the increased internal supply voltage $V_{INT}$ to a voltage level within the supply voltage range in accordance with a predetermined relationship, in order that the increased internal supply voltage $V_{INT}$ can be compared with an internally produced reference potential $V_{Ref}$.

Instead of the illustrated control circuit 4, the supply source 1 (or charge pump 10) can also be switched on for a specific time period at regularly defined intervals, if it is found that the charge flowing away via the internal supply voltage line 3 is no greater than the charge provided during the times in which the supply source 1 (or charge pump 10) is switched on.

Furthermore, the time control for defining the switching-on and switching-off times and the time for which the supply source 1 is switched on may also be made dependent on the temperature, with the time for which it is switched on being set as a function of the temperature of the integrated circuits in which the voltage supply circuit is operated. This is worthwhile because the leakage current behavior of circuits and of the supply voltage line 3 which are supplied with the internal supply voltage $V_{INT}$ may in some cases depend considerably on the temperature.

FIG. 3 shows a further embodiment of the invention. The voltage supply circuit has two supply sources 21, 22, to which the same external supply voltage $V_{EXT}$ or different external supply voltages $V_{EXT1}$, $V_{EXT2}$ is or are supplied. The first supply source 21 generates, for example, a first internal supply voltage $V_{INT1}$, and the second supply source 22 generates a second internal supply voltage $V_{INT2}$. A common control circuit 23 is provided and emits at its control connections a control signal which is identical for both supply sources 21, 22. The control signal is produced at the output of the SR flipflop 6, whose set input (as explained for the previous embodiments) is coupled to a pulse transmitter 7. The pulse transmitter 7 generates the periodic trigger pulse to set the SR flipflop 6, and thus to draw the output of the SR flipflop 6 to a high level, as a result of which the supply sources 21, 22 and, optionally, the two comparators 24 and 25 (if these are designed to be switchable) are switched on.

The control unit has a first comparator 24 and a second comparator 25, which are respectively connected to the first internal supply voltage line 26 and to the second supply voltage line 27. The first comparator 24 is connected by a further input to a first reference potential $V_{Ref1}$, and a further input of the second comparator 25 is connected to a second reference potential $V_{Ref2}$. The reference potentials $V_{Ref1}$, $V_{Ref2}$ correspond to the desired internal supply voltage potentials $V_{INT1}$, $V_{INT2}$ on the first and second supply voltage lines 26, 27, respectively, or differ from it by a predetermined difference value. The outputs of the comparators 24, 25 are connected to inputs of an AND gate 28. The output of the AND gate 28 is connected to the reset input of the SR flipflop 6. The control circuit 23 illustrated in this embodiment keeps the supply sources 21, 22 (and the two comparators 24 and 25) switched on until the respective internal supply voltage $V_{INT1}$, $V_{INT2}$ is essentially reached on each of the supply voltage lines 26, 27.

The illustrated exemplary embodiment has only two supply sources 21, 22. However, it is also possible to connect any desired number of supply sources to a single control circuit 23, which then has a corresponding number of comparators in order to check whether the respective internal supply voltage on the respective supply voltage line has been reached.

When using a switchable comparator, it is necessary to ensure after switching on the supply source and the comparator that sufficient time is provided for the comparator to reach a steady state, so that it can unambiguously decide whether the supply source must supply charge to the supply voltage line.

The embodiment in FIG. 3 is illustrated with supply sources 21, 22 in the form of step-down regulators. Charge pumps can also be provided, of course, as supply sources, in a corresponding manner to the embodiment shown in FIG. 2, in which case either a jointly generated or a separately generated auxiliary clock signal HCLK is or is not supplied, depending on the control signal produced at the output of the SR flip-flop.

Figure 4:
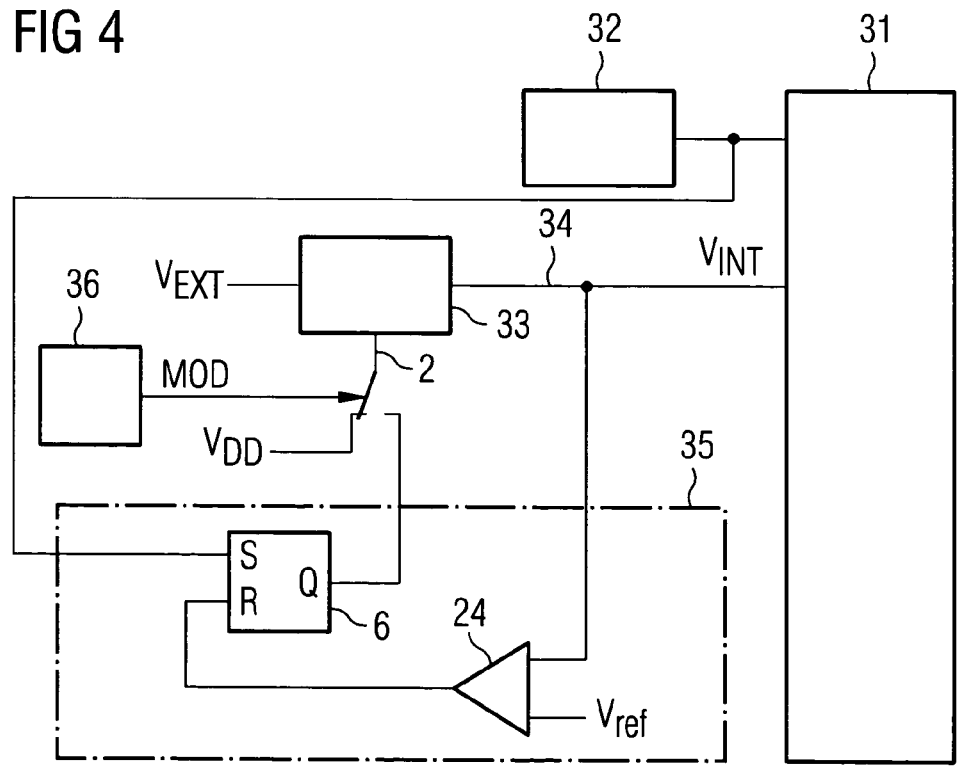
FIG. 4 shows an integrated DRAM memory circuit according to a further embodiment of the invention.

The embodiment in FIG. 4 shows a block diagram of an integrated memory circuit having a memory cell array 31, preferably a DRAM memory cell array. DRAM memory cells (not shown) in the DRAM memory cell array 31 must be refreshed at predetermined intervals, with the data located in them being read and then rewritten to them. The refreshing process is carried out by means of a refresh circuit 32, which is connected to the memory cell array 31. The refresh circuit 32 generates a refresh signal at regular intervals, and the refresh signal is applied to the control circuit 35 as a trigger pulse at the set input of the SR flip-flop 6. Since the greatest current flow on the internal supply voltage line 34 takes place in particular when refreshing the memory cells, it is worthwhile switching on the supply source 33 while refreshing the memory cells. The control circuit 35 operates in an essentially comparable manner to the embodiments in FIGS. 1 and 2, but can also include a time-controlled control process, so that, after receiving the refresh signal, the supply source 33, and optionally the comparator, remain switched on for a predetermined time period, and are then switched off until a corresponding flank of the refresh signal is received again.

Furthermore, a standby circuit 36 can be provided, which generates an operating mode signal MOD to either permanently apply a high level to the supply source 33, depending on the operating mode, to switch the supply source on permanently or to connect the supply source 33 to the control circuit 35 to be operated in a power-saving mode, in which the internal supply voltage is produced for a reduced current output. The current-saving mode is preferably assumed when the integrated circuit is in a standby mode. In the case of integrated memory circuits, this standby mode can be indicated by the signal CS (chip select) when the integrated memory circuit is not selected for writing or reading data.

In order to prevent the control process carried out by the control device 4, 23, 35 from causing excessive voltage fluctuations in the internal supply voltage $V_{INT}$ on the supply voltage line 3, 26, 27, 34, the supply voltage lines 3, 26, 27, 34 can be coupled to a capacitance which increases the total capacitance of the supply voltage line 3, 26, 27, 34 and thus allows a larger amount of charge to be stored.

While the foregoing is directed to embodiments of the present invention, other and further embodiments of the invention may be devised without departing from the basic scope thereof, and the scope thereof is determined by the claims that follow.

What is claimed is:

1. A voltage supply circuit for providing an internal supply voltage in an integrated circuit, comprising:
   a supply source for setting the internal supply voltage on a supply voltage line of the integrated circuit; and
   a control circuit connected to selectively switch the supply source on and off based on a comparison between a voltage level on the supply voltage line and a reference level, whereby a predefined voltage level is maintained on the supply voltage line; wherein the control circuit comprises a timer circuit configured to switch off the supply source after one of:
   a predetermined time period; and
   a time period which is dependent on a parameter of the integrated circuit.

2. The voltage supply circuit of claim 1, wherein the control circuit comprises:
   a determination unit for determining whether the voltage level on the supply voltage line is at least equal to a desired internal supply voltage, the determination unit configured to switch off the supply source when the voltage level on the supply voltage line has reached the desired internal supply voltage.

3. The voltage supply circuit of claim 1, wherein the supply source comprises a step-down regulator to which an external supply voltage is supplied, and wherein the step-down regulator produces the internal supply voltage, which is less than the external supply voltage.

4. The voltage supply circuit of claim 1, wherein the supply source comprises a charge pump to which an external supply voltage is supplied, and wherein the charge pump produces the internal supply voltage, which is higher than the external supply voltage.

5. The voltage supply circuit of claim 4, wherein the charge pump includes an auxiliary oscillator which provides an operating frequency for the charge pump, and wherein the control circuit connects the auxiliary oscillator to the charge pump when the supply source is switched on and disconnects the auxiliary oscillator from the charge pump when the supply source is switched off.

6. The voltage supply circuit of claim 1, wherein the supply source is controlled by the control circuit in a standby mode, and further comprising:
   a standby circuit configured to switch on the supply source constantly during normal operation.

7. The voltage supply circuit of claim 1, further comprising:
   a pulse transmitter configured to provide a signal for switching on the supply source.

8. The voltage supply circuit of claim 1, wherein the control circuit is configured to be switched off at least partially at the same time as the supply source.

9. An integrated dynamic random access memory (DRAM) circuit, comprising:
   a plurality of memory cells; and
   a voltage supply circuit connected to provide an internal supply voltage to the memory cells, the voltage supply circuit comprising:
   a supply source for setting the internal supply voltage on a supply voltage line;
   a pulse transmitter configured to provide a periodic signal for switching on the supply source; and
   a control circuit configured to selectively switch the supply source on and off based on a comparison between a voltage level on the supply voltage line and a reference level, whereby a predefined voltage level is maintained on the supply voltage line.

10. The integrated DRAM circuit of claim 9, further comprising:
    a refresh circuit configured to periodically refresh contents of the memory cells based on a refresh clock which is produced by a refresh clock transmitter, wherein the pulse transmitter is coupled to the refresh clock transmitter to switch on the supply source when memory cells are refreshed.

11. The integrated DRAM circuit of claim 9, wherein the pulse transmitter periodically switches-on the supply source based on a temperature function.

12. An integrated DRAM circuit, comprising:
    a plurality of memory cells; and
    a plurality of voltage supply circuits, each voltage supply circuit connected to provide a respective internal supply voltage to one or more memory cells, each voltage supply circuit comprising a respective supply source for setting the respective internal supply voltage on a respective supply voltage line; and
    a common control circuit connected to selectively switch the respective supply source on and off based on a comparison between a respective voltage level on the respective supply voltage line and a respective reference level, whereby a respective predefined voltage level is maintained on the respective supply voltage line, wherein the common control unit is further configured to switch-off the supply sources at the same time when switch-off signals have been received for each of the plurality of supply sources, wherein the common control unit includes a plurality of determination units, each unit configured to determine whether a respective voltage level on the respective supply voltage line has reached the respective internal supply voltage.

13. The integrated DRAM circuit of claim 9, further comprising:
    a pulse transmitter configured to provide a periodic signal for switching on the plurality of supply sources.

14. The integrated DRAM circuit of claim 13, further comprising:
    a refresh circuit configured to periodically refresh contents of the memory cells based on a refresh clock which is produced by a refresh clock transmitter, wherein the pulse transmitter is coupled to the refresh clock transmitter to switch on the supply source when memory cells are refreshed.

15. A method for controlling a supply source which provides an internal supply voltage to a supply voltage line of a dynamic random access memory device, comprising:
    selectively switching the supply source on and off based on a comparison between a voltage level on the supply voltage line and a reference level, whereby a predefined voltage level is maintained on the supply voltage line; wherein, during normal operation, the supply source is switched on constantly, and wherein, in a standby mode, the supply source is switched on and switched off repeatedly as a function of a signal provided by a control circuit in the dynamic random access memory device.

16. The method of claim 15, further comprising:
    determining whether a voltage on the supply voltage line is at least at the same level as a desired internal supply voltage, wherein the supply source is switched off when the voltage on the supply voltage line has reached the desired internal supply voltage.

17. The method of claim 15, wherein the supply source is switched off following a predetermined time period after being switched on.

18. A method for controlling a supply source which provides an internal supply voltage to a supply voltage line of a dynamic random access memory device, comprising:
  selectively switching the supply source on and off based on a comparison between a voltage level on the supply voltage line and a reference level, whereby a predefined voltage level is maintained on the supply voltage line; wherein, during normal operation, the supply source is switched on constantly, and wherein, in a standby mode, the supply source is switched on and switched off as a function of a signal provided by a control circuit in the dynamic random access memory device, and
  providing an operating frequency for operating the supply source, wherein the operating frequency is applied to the supply source when the supply source is switched on, and the operating frequency is disconnected from the supply source when the supply source is switched off.

19. A method for controlling a supply source which provides an internal supply voltage to a supply voltage line of a dynamic random access memory device, comprising:
  selectively switching the supply source on and off based on a comparison between a voltage level on the supply voltage line and a reference level, whereby a predefined voltage level is maintained on the supply voltage line; wherein, during normal operation, the supply source is switched on constantly, and wherein, in a standby mode, the supply source is switched on and switched off as a function of a signal provided by a control circuit in the dynamic random access memory device, and wherein the supply source is switched on and off based on a temperature function.

* * * * *